United States Patent [19]
Furman et al.

[11] Patent Number: 5,881,101
[45] Date of Patent: Mar. 9, 1999

[54] BURST SERIAL TONE WAVEFORM SIGNALING METHOD AND DEVICE FOR SQUELCH/WAKE-UP CONTROL OF AN HF TRANSCEIVER

[75] Inventors: William Nelson Furman; Thomas Gerard Kenney; Charles Allen Linn, all of Fairport; Michael Andrew Wadsworth, Henrietta, all of N.Y.

[73] Assignee: Harris Corporation, Melbourne, Fla.

[21] Appl. No.: 299,358

[22] Filed: Sep. 1, 1994

[51] Int. Cl.[6] ....................................................... H04B 1/10
[52] U.S. Cl. ..................... 375/217; 455/36.1; 455/212; 455/218; 455/343; 370/311
[58] Field of Search .................... 455/38.3, 212, 455/343, 35.1, 218, 221, 36.1, 37.1, 70, 220, 38.5, 22 J; 375/217, 351, 316, 321, 260, 277; 340/825.24; 370/311

[56] References Cited

U.S. PATENT DOCUMENTS

| | | |
|---|---|---|
| 3,584,304 | 6/1971 | Casterline et al. . |
| 3,613,004 | 10/1971 | Wycoff ..................................... 455/35.1 |
| 3,651,407 | 3/1972 | Sarallo et al. .......................... 455/36.1 |
| 3,654,555 | 4/1972 | Ryan et al. . |
| 3,873,925 | 3/1975 | Eastmond . |
| 3,899,739 | 8/1975 | Herman .................................. 455/35.1 |
| 3,962,553 | 6/1976 | Linder .................................... 455/38.3 |
| 3,962,646 | 6/1976 | Tempka .................................... 455/218 |
| 4,020,421 | 4/1977 | Elder et al. . |
| 4,047,009 | 9/1977 | Challen . |
| 4,132,953 | 1/1979 | Martin, III .............................. 455/218 |
| 4,172,996 | 10/1979 | Tokunaga et al. . |
| 4,344,175 | 8/1982 | Leslie . |
| 4,430,755 | 2/1984 | Nadir et al. ............................... 455/77 |
| 4,523,332 | 6/1985 | Mori ........................................ 455/343 |
| 4,541,118 | 9/1985 | Eastmond et al. ......................... 455/35 |
| 4,718,116 | 1/1988 | Jacobs et al. ........................... 455/245 |
| 4,724,545 | 2/1988 | Hamda .................................... 455/212 |
| 4,736,461 | 4/1988 | Kawasaki et al. ...................... 455/38.3 |
| 4,783,845 | 11/1988 | McChesney et al. .................. 455/35.1 |
| 4,996,717 | 2/1991 | Koening ................................. 455/35.1 |
| 5,003,556 | 3/1991 | Curtis et al. ............................ 455/218 |
| 5,014,343 | 5/1991 | Place . |
| 5,058,205 | 10/1991 | Roehrs et al. ............................ 455/35 |
| 5,109,530 | 4/1992 | Stengel .................................. 455/38.3 |
| 5,163,158 | 11/1992 | Tendler et al. ......................... 455/11.1 |
| 5,440,560 | 8/1995 | Rypinski ............................... 455/38.3 |
| 5,490,166 | 2/1996 | Heinzelmann ......................... 375/217 |
| 5,575,002 | 11/1996 | Mulford ................................ 455/35.1 |

*Primary Examiner*—Wellington Chin
*Assistant Examiner*—Jean B Corrielus
*Attorney, Agent, or Firm*—Rogers & Killeen

[57] ABSTRACT

A device and method for controlling HF single side band radio squelch operation in which a serial tone burst indicates the start and end of a transmission and identifies an on-going transmission. Additionally, receivers in a power saving sleep mode can be activated by receipt of a set of serial tone bursts that have been transmitted with sufficient duration for the receiver to be assured the opportunity to detect them. During the subsequent transmission of information, single "keep-alive" serial tone bursts are transmitted at random time intervals. The end of a transmission is signalled by another set of serial tone bursts. The bursts are provided with the transmitted signal on its frequency and preserve signal bandwidth.

29 Claims, 2 Drawing Sheets

BURST SERIAL TONE WAVEFORM SIGNALING METHOD AND DEVICE FOR SQUELCH/WAKE-UP CONTROL OF AN HF TRANSCEIVER

BACKGROUND OF THE INVENTION

The present invention relates to methods and devices for squelching an audio output from a radio, and more particularly to a device and method for controlling HF radio squelch operation in which a serial tone burst indicates the start and end of a transmission and identifies an on-going transmission.

Transmission of radio signals, particularly high frequency (HF) signals, is subject to a number of degradations over which the operators have little, or no, control, such as noise, interference, and fading. These degradations may be heard as unwanted sounds in an audio output of a radio receiver, and are controlled to the extent possible with a squelching device. The determination when to activate the squelching device can be important in that inopportune timing of the activation of the device can lead to loss of the desired signal.

Traditional approaches to the problem of squelching device operation, particularly in HF single side band (SSB) radios, have included active squelching techniques in which a pilot tone is transmitted with the desired signal. The pilot tone is selected to be easily detectable and is excised with a notch filter at the radio receiver. However, the pilot tone decreases the amount of transmitted power available for the desired signal. Further, where data are sent with the pilot tone to provide control signals to a receiver squelching device, the SSB channel bandwidth is restricted. As is known, reducing the bandwidth available for voice transmission reduces intelligibility.

Accordingly, it is an object of the present invention to provide a novel method and device for controlling radio squelch operation that obviates the problems of the prior art.

It is another object of the present invention to provide a novel method and device for controlling HF SSB radio squelch operation in which a serial tone burst indicates the start and end of a transmission and identifies an on-going transmission.

It is yet another object of the present invention to provide a novel method of activating a radio receiver that is in a low power consumption sleep mode and of determining whether to squelch an audio output from the receiver in which three sets of serial tone based burst waveforms activate a radio receiver and deactivate squelch, maintain squelch deactivated, and indicate the end of a signal and activate squelch.

It is still another object of the present invention to provide a novel method of providing serial tone bursts at random times after activation of the radio receiver in which squelch is activated if a predetermined number of the serial tone bursts are not received within a predetermined period of time.

It is a further object of the present invention to provide a novel device for selectively operating a radio receiver squelching device in response to receipt of serial tone bursts contained within a transmission received by the receiver, where the bursts include a signal indicating whether the squelching device is to mute the receiver's audio signal.

It is still a further object of the present invention to provide a novel device and method for determining whether to squelch or unsquelch audio output from a radio receiver in which serial tone bursts include a signal indicating whether to squelch or unsquelch the audio output.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

In a preferred embodiment the method and device of the present invention signal bursts are used to indicate events at which squelching may be effected, and to keep alive an on-going transmission. The bursts may be inserted into a transmission from a radio transmitter on its operating frequency and detected at a radio receiver. Radio receivers in a power saving sleep mode may be activated by receipt of a first set of bursts that have been transmitted with sufficient duration for the receiver to be assured the opportunity to detect them. During the subsequent transmission, keep-alive bursts may be transmitted at random time intervals. The keep-alive bursts may be excised from the received signal by delaying the audio, blanking detected bursts, and filling the blanked burst spaces with filtered versions of the audio. The end of a transmission may be signalled by a third set of bursts. A portion of some of the bursts may include a squelch/unsquelch command to indicate what action is be taken by the radio receiver's squelching device.

The bursts are preferably serial tone burst waveforms that may include a series of serial tone symbols (e.g., three symbols in a preferred embodiment). Each symbol may be generated by taking 32 pseudo-randomly generated 8-ary phase shift keying (PSK) chips and quadrature modulating an 1800 Hz carrier. One or more of the symbols in each burst may include a command to the receiver's squelching device to activate or deactivate squelch. For example, a symbol may include a command or information (data bits) mapped into an orthogonal Walsh function sequence which may be used to phase modulate the 8-ary PSK chips. The bursts are short, on the order of 40 milliseconds, and thus consume an exceedingly low percentage of the transmit power. Further, because the bursts are short, blanking and filling preserves the full baseband bandwidth of the signal (e.g., a 3 KHz audio signal) without noticeable degradation of the signal.

Figure 3:
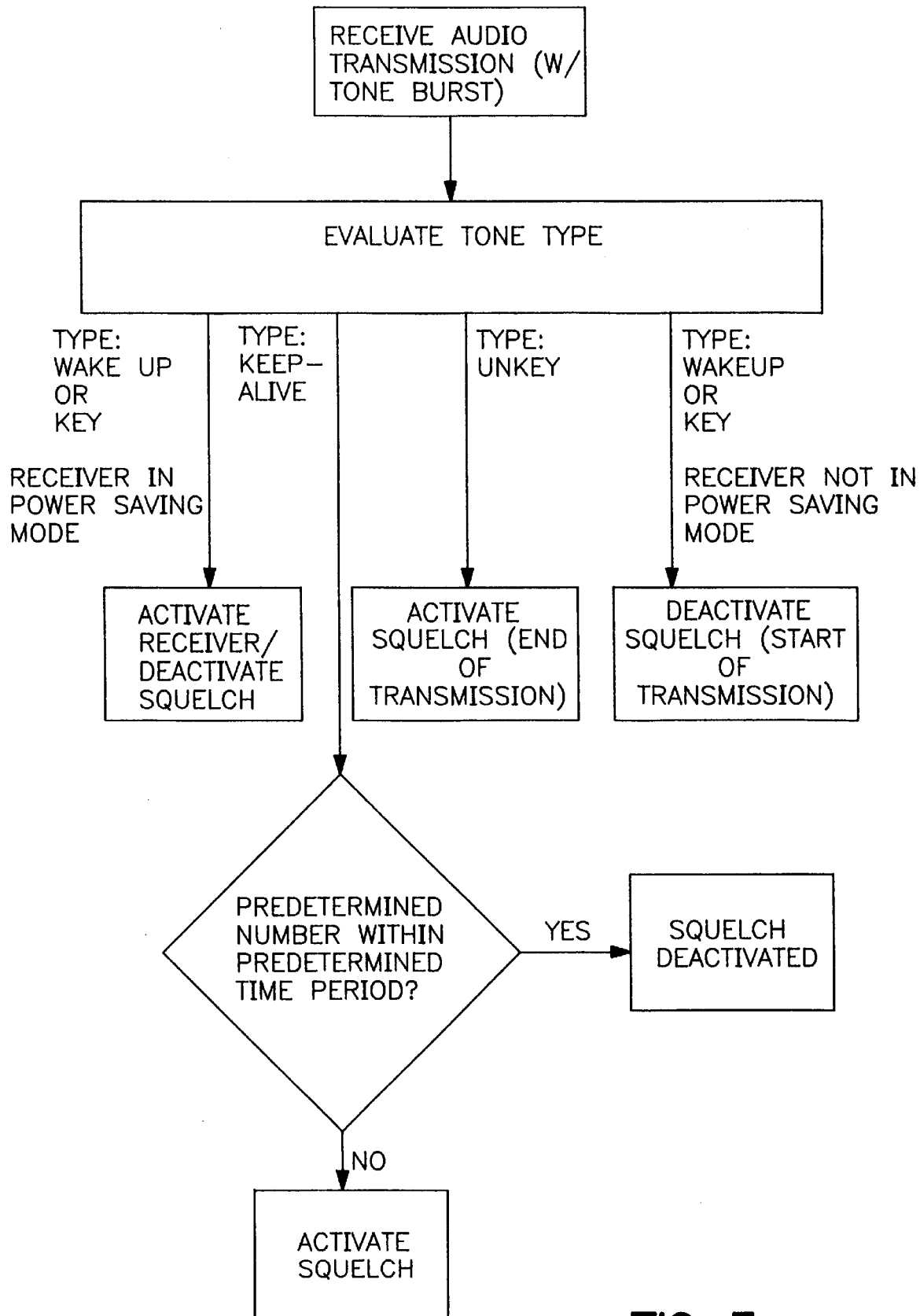
FIG. 3 is a flowchart of the tone evaluation process of a receiver in the present invention.

Four as shown in FIG. 3 burst sequences may be used; a first set of bursts for waking up a radio receiver in a power saving sleep mode (WAKEUP), a second set for keeping alive the on-going transmission (KEEP-ALIVE), and a third set for ending a transmission (UNKEY). A fourth set of bursts may also be used at the start of a transmission to a radio receiver which is not in a power saving sleep mode.

A WAKEUP may include a sequence of bursts of sufficient duration so that a radio receiver in a sleep mode will be assured of having an opportunity to detect the WAKEUP. For example, a WAKEUP may include a sequence of 45 bursts (which is 1.8 seconds in length) to ensure that waveform is present at the receiver for a complete search interval. One of the symbols in each of the bursts in the WAKEUP may include a command to deactivate the receiver's squelching device.

Once transmission has begun, KEEP-ALIVEs may be inserted into the transmission at random time intervals with a maximum time between insertions, for example, KEEP-ALIVE intervals may be uniformly distributed between one and two seconds. Each KEEP-ALIVE may include a single burst. If the receiver does not receive a predetermined number of the single KEEP-ALIVEs within a predetermined time period (one single burst in 6 seconds) the keep-alive logic (discussed below) may assume that the transmission has either ended or has been degraded to the point where it is unintelligible, and may activate the receiver's squelching device. At the receiver, the portion of the transmission taken by the KEEP-ALIVE can be blanked and filled so that there is no noticeable degradation of the audio signal. The KEEP-ALIVEs may optionally include a command to deactivate the receiver's squelching device, and the de-activation of the squelching device may depend on the receipt of a predetermined number of such commands in a predetermined time period.

Conversely, if a receiver that is squelched detects two KEEP-ALIVE sequences within a predetermined time period (e.g., six seconds), the receiver may unsquelch.

At the end of a transmission, an UNKEY may be transmitted to indicate that squelch is to be activated. For example, an UNKEY may include a sequence of three bursts, each with a symbol containing an activate squelch command. If transmission is resumed within a predetermined period of time, a distant receiver's return to stand-by time out interval, the optional fourth burst sequence, KEY, may be transmitted. A KEY may include, for example, a sequence of three bursts, each with a symbol containing a command to deactivate squelch.

In the operation of the above, in the event of a WAKEUP, KEY and UNKEY event, activation or deactivation of the squelching device may be made dependent on receipt of a predetermined number of commands or bursts. The prescribed number of bursts required in a time period may be changed to set acceptable false alarm and miss rates.

Figure 1:
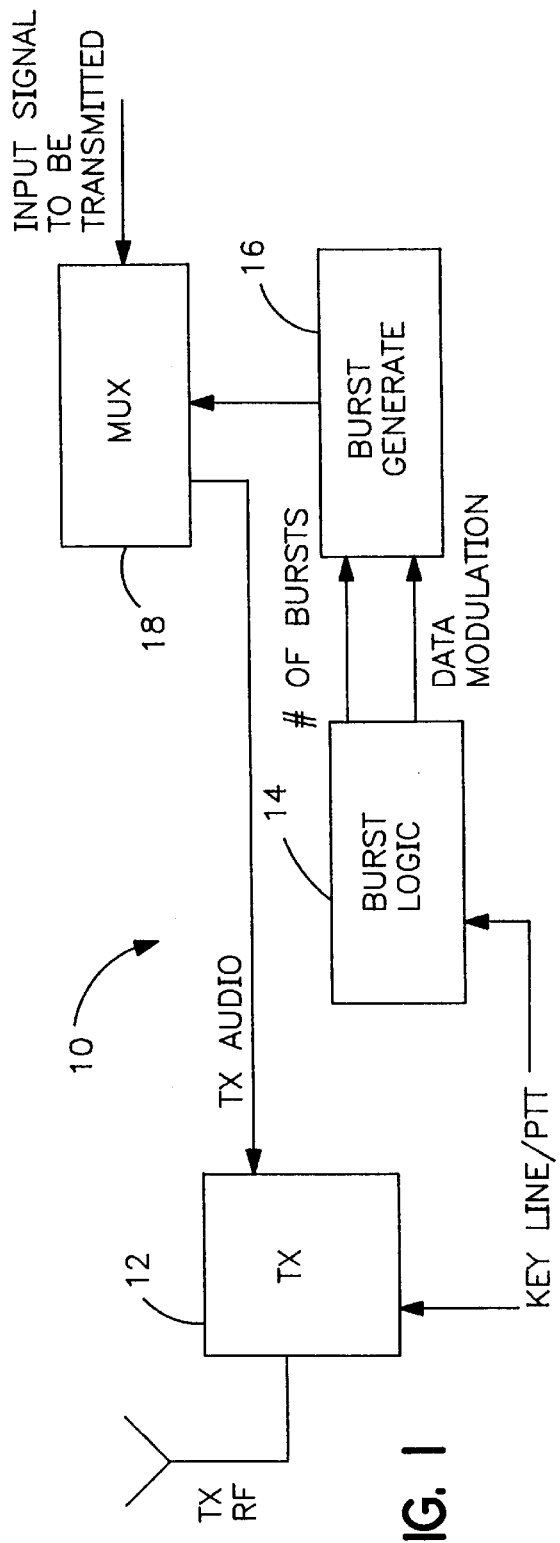
FIG. 1 is a block diagram of an embodiment of a transmitter of the present invention.

With reference now to FIG. 1, an embodiment of a transmitter 10 of the present invention may include a conventional radio frequency transmitter 12, such as an HF SSB transmitter. Transmitter information (i.e., key, unkey events) is provided to a burst logic circuit 14 that monitors transmitter 12 operation and determines what type of burst is to be added to the transmission. The logic circuit 14 may use a simple rule-based algorithm that provides the number of bursts (e.g., one for KEEP-ALIVE, three for KEY and UNKEY, and a longer sequence for WAKEUP), and the data (i.e., the squelch activate/deactivate command) to be included in one of the symbols in the bursts. The logic circuit 14 may include a timer for the randomly transmitted KEEP-ALIVEs. Burst information may be provided to a burst generator 16 that generates the desired bursts and sends them to an audio/burst multiplexer 18 for switching the burst into the audio signal for transmission.

Figure 2:
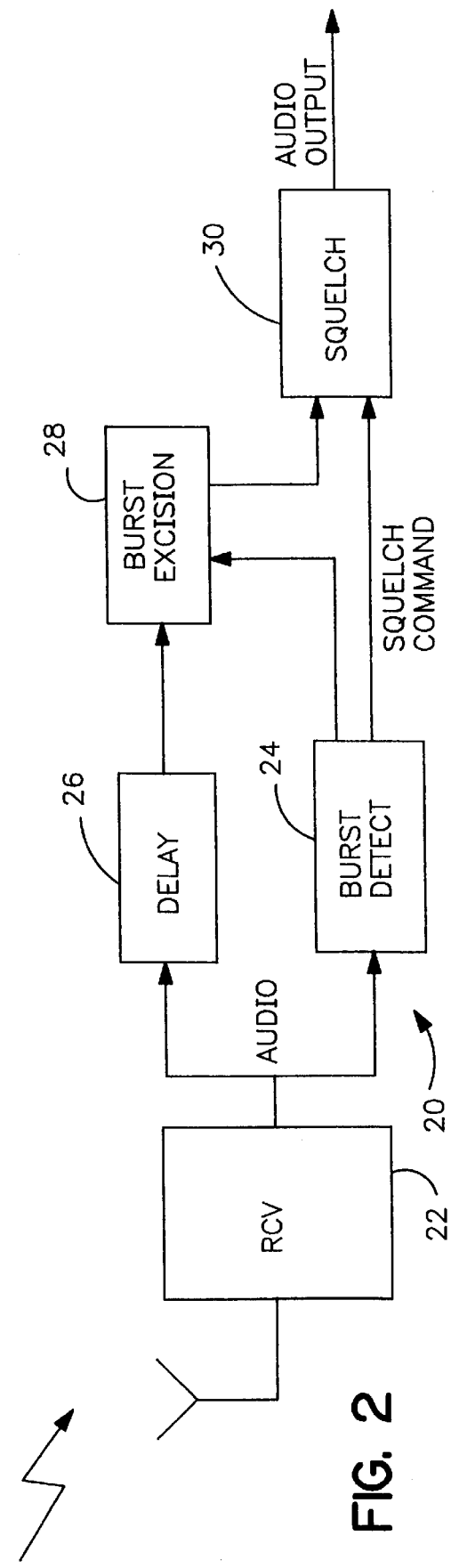
FIG. 2 is a block diagram of an embodiment of a receiver of the present invention.

With reference now to FIG. 2, an embodiment of a receiver 20 of the present invention may include a conventional radio frequency receiver 22, such as an HF SSB receiver. Received audio may be split into two paths, with one path feeding a burst detection demodulator 24, and the other path feeding a signal delay component 26. When a burst is detected by demodulator 24 a signal is sent to a burst exclusion component 28 that blanks the burst portion of the received signal and fills it with the portion of the audio immediately preceding the burst. The "patched" audio is provided to a squelching device 30 for processing. The squelching device 30 may be conventional and may process incoming audio responsive to the command received and decoded in the burst detector 24. The burst detector may include a logic circuit that monitors incoming transmissions and determines what type of burst has been added to the transmission. The logic circuit in the burst detector 24 may use a simple rule-based algorithm to identify the number of bursts, and the command included in one of the symbols in the bursts. The logic circuit may include a timer for keeping track of the randomly transmitted KEEP-ALIVEs.

While the foregoing description is primarily in terms of a radio communicating voice signals, the present invention is equally applicable to radios transmitting data signals (such as a modem). In such systems, the KEEP ALIVE codes might not be sent, as they could interfere with the data signal. However, in such situations the radio could use a "modem sync" signal to determine that data was still being sent and to operate its squelch accordingly.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of activating a radio receiver that is in a low power consumption sleep mode so that the radio receiver can receive a signal and of determining whether to squelch an audio output from the radio receiver, the method comprising the steps of:

(a) providing a first serial tone based burst waveform to activate the radio receiver and to deactivate squelch;
   (b) providing plural second serial tone based burst waveforms at random times during reception of a signal for maintaining deactivated squelch; and
   (c) providing a third serial tone based burst waveform to indicate the end of a signal and to activate squelch.

2. The method of claim 1 further comprising the step of activating squelch if a predetermined number of the second serial tone based burst waveforms are not received within a predetermined period of time.

3. The method of claim 1 wherein the first serial tone based burst waveform has a length sufficient to ensure reception of the first serial tone based burst waveform at the radio receiver when the radio receiver is in the sleep mode.

4. The method of claim 1 wherein the first, second, and third serial tone based burst waveforms each comprise a series of plural serial tone symbols, and further comprising the step of providing a signal in one of the serial tone symbols in each of the first and third based burst waveforms indicating whether to activate or deactivate squelch.

5. The method of claim 4 wherein the second serial tone based burst waveforms each comprise a single burst of three of the serial tone symbols.

6. The method of claim 1 further comprising the step of providing a fourth serial tone based burst waveform to deactivate squelch at the beginning of a signal in the event that the receiving radio is not in a power-saving sleep mode.

7. A method of determining whether to squelch or unsquelch an audio output from a radio receiver comprising the steps of:

(a) providing serial tone bursts in an audio signal transmission received by the radio receiver for controlling the audio output of the receiver, each of the serial tone bursts including a first signal indicating whether to squelch or unsquelch the audio output;

(b) evaluating the first signal in each of the serial tone bursts at the radio receiver; and (c) controlling the audio output of the radio receiver responsive to the evaluation.

8. The method of claim 7 wherein the step of providing serial tone bursts comprises the step of providing a first serial tone burst at the beginning of a transmission to the radio receiver to activate the radio receiver and wherein the first signal therein is to deactivate squelch.

9. The method of claim 7 wherein the step of providing serial tone bursts comprises the step of providing plural second serial tone bursts at random times after activation of the radio receiver and wherein the first signal therein is to deactivate squelch.

10. The method of claim 9 further comprising the step of activating squelch if a predetermined number of the second serial tone bursts are not received within a predetermined period of time.

11. The method of claim 9 wherein the random times between the serial tone bursts is no more than about two seconds.

12. The method of claim 7 wherein the step of providing serial tone bursts comprises the step of providing a third serial tone burst at the end of the transmission and wherein the first signal therein is to activate squelch.

13. The method of claim 7 wherein the serial tone bursts each comprise a series of plural serial tone symbols, and further comprising the step of providing the first signal in one of the serial tone symbols in each of the bursts.

14. The method of claim 7 wherein the method determines whether to squelch or unsquelch audio output from an HF radio receiver.

15. The method of claim 7 further comprising the steps of:
(d) delaying a portion of the transmission received by the radio receiver; and
(e) filling the serial tone bursts with the received audio preceding the serial tone bursts.

16. A radio transmitter comprising:
a serial tone burst generator for,
generating a first serial tone based burst waveform to activate a radio receiver from a sleep mode, said first waveform including a first signal for deactivating squelch at the radio receiver,
generating a plurality of second serial tone based burst waveforms after activation of the radio receiver, and
generating a third serial tone based burst waveform to indicate the end of a transmission from a transmitter, said third waveform including a second signal for activating squelch at the radio receiver;
a logic circuit for instructing said generator to generate one of said first, second, and third waveforms; and
a multiplexer for adding said first, second, and third waveforms from said generator to a transmission from said transmitter.

17. The radio transmitter of claim 16 wherein said logic circuit generates said second waveforms at random times no more than about two seconds apart.

18. The radio transmitter of claim 16 wherein each of said first, second, and third serial tone based burst waveforms comprise a series of plural serial tone symbols.

19. The radio transmitter of claim 18 wherein one of said symbols in each of said first and third based burst waveforms indicates whether squelch is to be activated or deactivated at the radio receiver.

20. A radio receiver comprising:
squelch means for muting an audio signal from said receiver; and
means for selectively operating said squelch means responsive to serial tone bursts contained within a transmission received by said receiver, said bursts including a first signal indicating whether said squelch means is to mute the audio signal,
wherein said means for operating said squelch means mutes the audio signal if a predetermined number of said serial tone bursts are not received within a predetermined period of time.

21. A radio receiver comprising:
squelch means for muting an audio signal from said receiver;
means for selectively operating said squelch means responsive to serial tone bursts contained within a transmission received by said receiver, said bursts including a first signal indicating whether said squelch means is to mute the audio signal;
delay means for delaying a portion of the transmission received by said receiver, and fill means for inserting a preceding audio into the transmission in place of said serial tone bursts.

22. A method of determining whether to squelch an audio output from a radio receiver, the method comprising the steps of:
(a) providing a first serial tone based burst waveform to deactivate squelch at the radio receiver;
(b) providing a plurality of second serial tone based burst waveforms during reception of a signal for maintaining deactivated squelch; and
(c) providing a third serial tone based burst waveform to activate squelch.

23. The method of claim 22 further comprising the step of providing the plurality of second serial tone based burst waveforms in an audio signal received by the radio receiver.

24. The method of claim 23 further comprising the step of replacing in the audio output each of the plurality of second serial tone based burst waveforms with a portion of the preceding received audio signal.

25. The method of claim 23 further comprising the step of providing the plurality of second serial tone based burst waveforms at random times during reception of the audio signal.

26. The method of claim 22 further comprising the step of providing the first, the plurality of second and third serial tone based burst waveforms in an audio signal received by the radio receiver.

27. The method of claim 22 wherein the first, the plurality of second, and third serial tone based burst waveforms each comprise a series of plural serial tone symbols.

28. The method of claim 27 further comprising the step of providing a signal in one of the serial tone symbols indicating whether to activate or deactivate squelch.

29. The method of claim 27 wherein the plurality of second serial tone based burst waveforms each comprise a single burst of three of the serial tone symbols.

* * * * *